US007910496B2

United States Patent
Feustel et al.

(10) Patent No.: US 7,910,496 B2
(45) Date of Patent: Mar. 22, 2011

(54) TECHNIQUE FOR FORMING AN INTERLAYER DIELECTRIC MATERIAL OF INCREASED RELIABILITY ABOVE A STRUCTURE INCLUDING CLOSELY SPACED LINES

(75) Inventors: Frank Feustel, Dresden (DE); Kai Frohberg, Niederau (DE); Carsten Peters, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 84 days.

(21) Appl. No.: 12/020,234

(22) Filed: Jan. 25, 2008

(65) Prior Publication Data
US 2009/0001526 A1 Jan. 1, 2009

(30) Foreign Application Priority Data
Jun. 29, 2007 (DE) .......................... 10 2007 030 058

(51) Int. Cl.
*H01L 21/76* (2006.01)

(52) U.S. Cl. ................................. 438/778; 257/E21.54

(58) Field of Classification Search .................. 438/758, 438/759, 778, 787, 791; 257/E21.001, E21.532, 257/E21.54
See application file for complete search history.

(56) References Cited

U.S. PATENT DOCUMENTS

| 5,872,401 | A | * | 2/1999 | Huff et al. | 257/758 |
| 6,054,333 | A | * | 4/2000 | Bensaoula | 438/9 |
| 6,291,331 | B1 | | 9/2001 | Wang et al. | 438/618 |
| 7,009,226 | B1 | | 3/2006 | Sun | 257/192 |
| 7,244,984 | B2 | * | 7/2007 | Kamigaichi et al. | 257/315 |
| 2005/0136642 | A1 | | 6/2005 | Lee et al. | 438/622 |
| 2005/0136684 | A1 | * | 6/2005 | Mukai et al. | 438/778 |
| 2005/0263825 | A1 | | 12/2005 | Frohberg et al. | 257/369 |
| 2006/0138666 | A1 | | 6/2006 | Kim | 257/760 |
| 2006/0172481 | A1 | | 8/2006 | Tsui et al. | 438/199 |
| 2007/0013076 | A1 | | 1/2007 | Akiyama | 257/758 |
| 2007/0018203 | A1 | | 1/2007 | Atanackovic et al. | 257/254 |
| 2007/0037395 | A1 | | 2/2007 | Beachy et al. | 438/689 |
| 2007/0077708 | A1 | * | 4/2007 | Frohberg et al. | 438/257 |

(Continued)

FOREIGN PATENT DOCUMENTS

DE 102004031744 7/2006

(Continued)

OTHER PUBLICATIONS

Pennington et al., "An Improved Interlevel Dielectric Process for Submicron Double-Level Metal Products", VMIC Conference (1999): pp. 355-359.*

(Continued)

*Primary Examiner* — Matthew S Smith
*Assistant Examiner* — Michele Fan
(74) *Attorney, Agent, or Firm* — Williams, Morgan & Amerson, P.C.

(57) ABSTRACT

By removing excess material of an interlayer dielectric material deposited by SACVD, the gap filling capabilities of this deposition technique may be exploited, while, on the other hand, negative effects of this material may be reduced. In other aspects, a buffer material, such as silicon dioxide, may be formed prior to depositing the interlayer dielectric material on the basis of SACVD, thereby creating enhanced uniformity during the deposition process when depositing the interlayer dielectric material on dielectric layers having different high intrinsic stress levels. Consequently, the reliability of the interlayer dielectric material may be enhanced while nevertheless maintaining the advantages provided by an SACVD deposition.

23 Claims, 4 Drawing Sheets

U.S. PATENT DOCUMENTS

| | | | |
|---|---|---|---|
| 2007/0145592 A1 | 6/2007 | Kwon | 257/760 |
| 2007/0155162 A1 | 7/2007 | Lee | 438/624 |
| 2008/0003773 A1* | 1/2008 | Kwak et al. | 438/425 |
| 2008/0081406 A1* | 4/2008 | Choo et al. | 438/199 |
| 2008/0296693 A1 | 12/2008 | Richter et al. | 257/368 |

FOREIGN PATENT DOCUMENTS

| | | |
|---|---|---|
| KR | 10-0681677 | 2/2007 |
| WO | WO 2007/054403 | 5/2007 |

OTHER PUBLICATIONS

Database Inspec [Online], The Institution of Electrical Engineers, Stevenage, GB, 1989, XP-002502709, Database accession No. 3545628.

PCT Search Report and Written Opinion from PCT/US2008/008153 dated Apr. 9, 2009.

* cited by examiner

TECHNIQUE FOR FORMING AN INTERLAYER DIELECTRIC MATERIAL OF INCREASED RELIABILITY ABOVE A STRUCTURE INCLUDING CLOSELY SPACED LINES

BACKGROUND OF THE INVENTION

1. Field of the Invention

Generally, the present disclosure relates to the formation of integrated circuits, and, more particularly, to the formation of a dielectric interlayer between and over circuit elements including closely spaced lines, such as gate electrodes, polysilicon interconnect lines and the like.

2. Description of the Related Art

During the fabrication of integrated circuits, a large number of circuit elements are formed on a given chip area according to a specified circuit layout. Generally, a plurality of process technologies are currently practiced, wherein, for complex circuitry, such as micro-processors, storage chips and the like, MOS technology based on silicon is currently the most promising approach due to the superior characteristics in view of operating speed and/or power consumption and/or cost effectiveness. During the fabrication of complex integrated circuits using MOS technology, millions of transistors, i.e., N-channel transistors and/or P-channel transistors, are formed on a substrate including a crystalline semiconductor layer, such as a silicon-based layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors, resistors and the like, are formed in a common layer, which will be referred to hereinafter as a device layer, whereas the "wiring," i.e., the electrical connection of circuit elements according to the circuit design, may be accomplished only to a certain degree by means of polysilicon lines and the like within the device layer so that one or more additional "wiring" layers formed over the device layer may be required. These wiring layers include metal lines embedded into an appropriate dielectric material, such as silicon dioxide, silicon nitride and the like, or, in advanced devices, low-k materials having a permittivity of 3.0 or less are used. The metal lines and the surrounding dielectric material will be referred to hereinafter as a metallization layer. Between two stacked adjacent metallization layers and also between the device layer and the first metallization layer, respective dielectric interlayers are formed through which metal-filled openings are formed to establish the electrical connection between metal lines or between circuit elements and metal lines. In typical applications, the dielectric interlayer separating the device layer from the first metallization layer is essentially formed from silicon dioxide that is deposited above a dielectric etch stop layer by well-established plasma enhanced chemical vapor deposition (PECVD) techniques, which enable the formation of a smooth and dense silicon dioxide film with sufficient conformality at moderately high deposition rates. Due to the continuous device scaling resulting in gate lengths of MOS transistors on the order of 50 nm or less, the distances between neighboring circuit elements, such as polysilicon lines, gate electrodes and the like, are also reduced and have now reached in modern CPUs approximately 200 nm and less, which translates into approximately 100 nm or less for the space width between the densely packed polysilicon lines. It turns out, however, that the gap-fill capabilities of well-established high rate PECVD techniques for the deposition of silicon nitride, which is frequently used as material for the etch stop layer, and silicon dioxide, which is often used as interlayer dielectric, may no longer suffice to reliably form a dielectric interlayer, thereby requiring a fill technique providing enhanced fill capabilities as will be described in more detail with reference to FIGS. 1a-1b.

In FIG. 1a, a semiconductor device 100 comprises a substrate 101 that may be a bulk silicon substrate or a silicon-on-insulator (SOI) substrate having formed thereon a device layer 102 including, for instance, a silicon-based layer 110, in and on which is formed a structure 103 that may comprise closely spaced polysilicon lines 104. The device layer 102 may represent a substantially crystalline silicon region in which and on which circuit elements, such as field effect transistors, capacitors and the like, are formed. The structure 103 may represent an area having a plurality of dense polysilicon lines, or the lines 104 may represent portions of gate electrodes of transistor elements. The lines 104 may have formed on sidewalls thereof corresponding spacer structures 105, as are typically used for forming gate electrode structures. The spacer structures 105 may include a plurality of spacers, such as an offset spacer 105A and one ore more "outer" spacers 105C, and a liner 105B that may act as an etch stop layer during an etch process for forming the respective spacers 105C. The structure 103 further comprises an etch stop layer 109, typically comprised of silicon nitride, that is formed over the device layer 102 to cover the layer 110 and the line structure 103. A silicon dioxide layer 107 is formed above the etch stop layer 109 so as to completely enclose the line structure 103.

A typical conventional process flow for forming the device 100 as shown in FIG. 1a may include the following processes. After fabrication processes to form circuit elements, such as transistors, capacitors and the line structure 103, which include well-established lithography, deposition, etch, implantation and other techniques, the etch stop layer 109 is formed, typically by PECVD, since PECVD of silicon nitride may be accomplished at moderately low temperatures of less than approximately 600° C., which is compatible with preceding manufacturing processes and materials, such as metal silicides and the like. In many conventional techniques, the etch stop layer 109 may be provided with a high intrinsic stress level so as to act as a strain-inducing source for creating a strain in an area 108 located below the lines 104. When the lines 104 represent gate electrodes, the area 108 may be considered as a channel region of a transistor, in which the induced strain may result in a modified charge carrier mobility. For example, for a standard crystallographic orientation of the semiconductor layer 110, that is, when the layer 110 represents a silicon-based material having a surface orientation (100) with the channel length oriented along a <110> direction, a compressive strain in the area 108 may result in an improvement of the hole mobility while a tensile strain may result in an improvement of the electron mobility. The enhanced charge carrier mobility thus directly translates into enhanced transistor performance with respect to current drive capability and operating speed. In order to selectively enhance the transistor performance, the etch stop layer 109 may be deposited on the basis of appropriately selected process parameters so as to obtain the desired degree and type of intrinsic stress. For example, silicon nitride may be deposited by PECVD with high tensile or compressive stress, depending on the deposition parameters. Moreover, well-established process sequences may be used to selectively form portions of the etch stop layer 109 with a different type of intrinsic stress above different transistors in order to enhance the performance of both N-type transistors and P-type transistors.

As previously discussed, the ongoing shrinkage of feature sizes also means that a distance between neighboring circuit elements, such as a distance 111 between the closely spaced lines 104, is reduced and may be as low as approximately 100 nm, or the distance 111 may even be as small as 30 nm and even less for CPUs of the 90 nm technology node. Hence, any deposition techniques for forming a dielectric layer for embedding the line structure 103 with open spaces therebetween have to meet the requirements of an appropriate fill capability so as to reliably and completely fill the empty spaces between the densely spaced lines 104. By means of PECVD process recipes for silicon nitride, the layer 109 may be deposited in a more or less conformal fashion with a thickness in the range of approximately 10-100 nm, wherein possibly different types of intrinsic stress may be provided above respective portions of the structure, thereby requiring sophisticated deposition and patterning strategies, in particular when the creation of voids 106a is to be suppressed.

Thereafter, the silicon dioxide layer 107 is deposited, which in less critical applications is typically done by PECVD on the basis of precursors TEOS (tetra-ethyl-orthosilicate) and oxygen, since PECVD, contrary to thermal TEOS chemical vapor deposition (CVD), allows the deposition of silicon dioxide in a moderately conformal manner—yet with significantly less gap filling qualities compared to thermal CVD—with relatively high mechanical stability at temperatures below 600° C. at high deposition rates, which provides a high production yield.

However, with the distance 111 approaching approximately 30 nm and even less, it turns out that the fill capabilities of well-established PECVD techniques for depositing silicon dioxide having superior material characteristics on the basis of TEOS and oxygen may not be adequate to completely fill the empty spaces between the lines 104, thereby possibly creating voids 106b, which may lead to severe reliability concerns during the further processing of the semiconductor device 100, i.e., during the fabrication of contacts providing an electrical connection between individual elements of the structure 103 to a metallization level to be formed. Moreover, it should be noted that the silicon dioxide layer 107 has a certain topography caused by the underlying structure of the device layer 102, for instance, by the line structure 103, which may jeopardize subsequent manufacturing processes, such as a photolithography step for forming contact openings to underlying portions of circuit elements located in the layer 110 or on the lines 104. Consequently, a standard process flow requires that the silicon dioxide layer 107 be planarized, typically by chemical mechanical polishing (CMP), wherein excess material of the silicon dioxide layer 107 is removed by chemical and mechanical interaction with a slurry and a polishing pad so as to finally obtain a substantially planarized surface of the silicon dioxide layer 107. The CMP process itself is a highly complex process and requires sophisticated process recipes, which significantly depend on the characteristics of the silicon dioxide layer 107, such as density, mechanical stress, water contents and the like. Hence, a great deal of effort is required to develop corresponding process recipes for reliable and reproducible CMP processes for PECVD TEOS silicon dioxide, as this material is frequently used for a dielectric interlayer in silicon-based semiconductor devices and even in devices formed from other semiconductors.

For this reason, the dielectric layer 107 formed on the silicon nitride layer 109 may be deposited by a different deposition technique having a significantly enhanced gap filling capability to avoid the creation of the voids 106b. Hence, the silicon dioxide layer 107 may be formed by a thermal CVD process on the basis of TEOS and ozone, which generates a silicon dioxide film exhibiting excellent gap filling capabilities, that is, this deposition technique provides even a "flow"-like behavior, thereby reliably filling the empty spaces between the lines 104. In view of the film and deposition characteristics, the thermal CVD process is typically performed at significantly higher pressures compared to the plasma enhanced deposition technique, for example, in the range of 200-760 Torr, and is therefore denoted as sub-atmospheric chemical vapor deposition (SACVD). However, the material and process characteristics of the SACVD oxide may differ significantly from the PECVD oxide, as, for instance, the layer 107 formed by SACVD may tend to incorporate moisture more readily and also exhibit an increased rate of out-gassing compared to PECVD oxide. Furthermore, the deposition rate is lower, resulting in a reduced throughput. For these reasons, the layer 107 is provided as an intermediate material used as a gap fill material and thereafter a further silicon dioxide layer 107A may be deposited by PECVD to provide the desired deposition rate and enhanced material characteristics for at least the upper portion of the interlayer dielectric material. Thus, during the further processing, for instance the planarization of the interlayer dielectric material 107A, well-established process techniques may be used, while, however, the inferior material characteristics of the SACVD oxide may have an inverse effect on the overall reliability of the final interlayer dielectric material and thus on the structure 103.

FIG. 1b schematically illustrates the semiconductor device 100 according to another illustrative example in which the deposition process having the desired high gap filling capability may result in a high degree of non-uniformity during the further processing of the device 100. As shown, the device 100 may comprise the etch stop layer in the form of a first portion 109A having a high intrinsic stress level, for instance, a high compressive stress, while a second portion 109B may have a high intrinsic stress level of opposite behavior, such as a tensile stress. As previously explained, the lines 104 of the structure 103 may represent gate electrode structures of transistors, in which an appropriately selected type of strain in the respective channel regions 108 may provide enhanced transistor performance, as previously explained. When forming the portions 109A, 109B, respective deposition parameters may be adjusted, such as the deposition pressure, temperature, precursor flow rate, ion bombardment and the like, in order to obtain the desired high intrinsic stress levels. For example, according to well-established process recipes, a stressed dielectric material may be deposited in a highly conformal manner and a portion thereof may then be removed to obtain, for instance, the portion 109A. Thereafter, the dielectric material may be deposited with the opposite intrinsic stress level to that of the portion 109B while an unwanted part thereof may be removed from above the portion 109A, thereby obtaining the configuration as shown in FIG. 1b.

During these manufacturing processes, the respective deposition parameters may also be selected so as to obtain a highly conformal deposition behavior in order to substantially avoid the creation of any voids between the densely spaced lines 104. Thereafter, the interlayer dielectric material 107 or a portion thereof may be deposited on the basis of the sub-atmospheric deposition process, as previously described, in order to ensure a reliable filling of the spaces between the lines 104. It turns out, however, that the growth rate during this deposition process may be different for a material having a high compressive stress and a tensile-stressed dielectric material, thereby resulting in a different layer thickness of the interlayer dielectric material 107 above the portions 109A, 109B. Consequently, during the further processing, for instance, when providing a further interlayer dielectric material, such as the material 107A, planarizing the resulting surface topography and the like, an increased degree of process non-uniformity may be encountered, which may also result in respective device non-uniformities, for instance, in view of a reduced planarity and the like.

Thus, although the enhanced gap filling capabilities of the sub-atmospheric deposition technique for silicon dioxide may be highly advantageous with respect to avoiding structure irregularities, in particular in densely packed line structures and gate electrodes, the inferior material characteristics, possibly in combination with deposition specific non-uniformities, may result in a reduced reliability and increased device irregularities, in particular for highly scaled semiconductor devices.

The present disclosure is directed to various techniques and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to process techniques and semiconductor devices in which enhanced gap filling capabilities during the formation of interlayer dielectric materials may be maintained, for instance on the basis of a sub-atmospheric deposition technique, while, on the other hand, negative influences, such as inferior material characteristics in terms of increased moisture absorption, increased degree of out-gassing, reduced mechanical stability and the like, as well as deposition-specific characteristics, such as low deposition rate, difference in deposition rates depending on the underlying material and the like, may be significantly reduced. For this purpose, the amount of interlayer dielectric material deposited by the deposition technique of enhanced gap filling capability may be reduced prior to providing the interlayer dielectric material having the desired material characteristics and/or the deposition behavior during the process having the desired high gap filling capability may be made more uniform by providing an appropriate conformal buffer layer.

One illustrative method disclosed herein comprises forming an etch stop material above circuit elements of a semiconductor device, wherein the circuit elements comprise densely packed line features. The method further comprises forming a first interlayer dielectric material above the circuit elements and the etch stop material by a first deposition process designed to substantially fill spaces formed between the densely packed line features. Moreover, a portion of the first interlayer dielectric material is removed to maintain the spaces at least partially filled with the first interlayer dielectric material and then a second interlayer dielectric material is formed above the first interlayer dielectric material.

Another illustrative method disclosed herein comprises forming a first etch stop layer above first transistors, wherein the first etch stop layer has an intrinsic compressive stress. The method further comprises forming a second etch stop layer above second transistors, wherein the second etch stop layer has an intrinsic tensile stress. Additionally, a buffer layer is formed above the first and second etch stop layers by a first deposition technique providing a substantially conformal deposition behavior in spaces between neighboring ones of the first and second transistors. Finally, the method comprises forming at least a portion of an interlayer dielectric material on the buffer layer by a second deposition technique having an increased gap filling capability compared to the first deposition technique.

One illustrative semiconductor device disclosed herein comprises a first device region comprising a plurality of densely packed gate electrode structures with a space defined between adjacent two of the gate electrode structures, wherein the plurality of gate electrode structures are formed above a semiconductor region. The semiconductor device further comprises an etch stop material formed above the plurality of gate electrode structures and a first interlayer dielectric material comprising silicon dioxide, wherein the first interlayer dielectric material is provided in the spaces with a height level that is less than a height level defined by the plurality of gate electrode structures and the etch stop material. Additionally, the semiconductor device comprises a second interlayer dielectric material comprising silicon dioxide, wherein the second interlayer dielectric material is formed above the first interlayer dielectric material and has a reduced moisture absorbing capability compared to the first interlayer dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
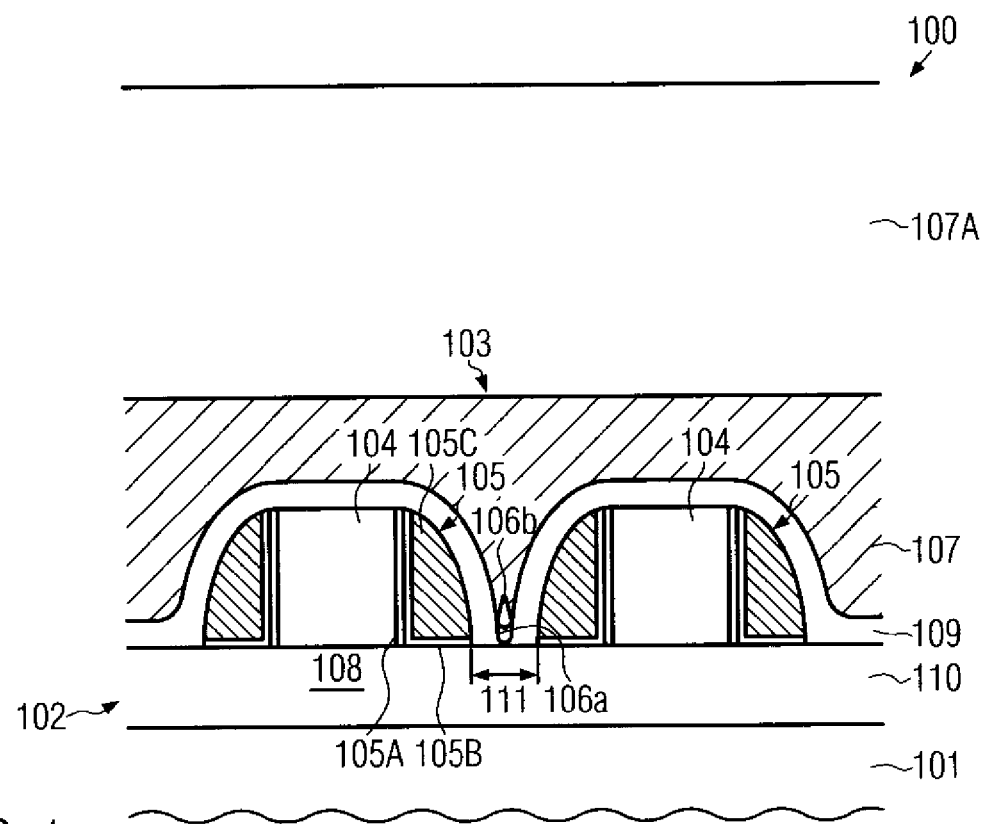
FIGS. 1a-1b schematically illustrate cross-sectional views of a semiconductor device including densely packed line structures such as gate electrodes, during various manufacturing stages in forming an interlayer dielectric material on the basis of a deposition technique having a high gap filling capability according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein addresses the problem of reduced interlayer dielectric reliability, which may be caused by inferior material characteristics and/or deposition-specific non-uniformities, in that a deposition technique having enhanced gap filling capabilities may be used for forming an interlayer dielectric material at least within spaces of densely packed circuit elements, while reducing any deleterious effects that may be associated with the deposition-specific characteristics and/or inferior material characteristics compared to other well-proved dielectric materials, such as silicon dioxide formed on the basis of PECVD techniques on the basis of TEOS, as previously explained. In some aspects, an enhanced behavior of the interlayer dielectric material may be obtained by using the deposition technique of enhanced gap filling capability in order to efficiently reduce the respective aspect ratio of spaces formed between closely spaced line structures, such as gate electrodes and the like, while substantially not providing any excess material in other device areas, thereby reducing the overall amount of interlayer dielectric material having less desirable material characteristics. Consequently, the essential portion of interlayer dielectric material may be provided to have superior material characteristics achieved by respective deposition techniques, such as PECVD, wherein the preceding reduction of the aspect ratios may thus avoid or at least substantially reduce the probability of void formation during the respective deposition process.

In some illustrative embodiments, a removal of any excess material of the interlayer dielectric material of inferior characteristics may be accomplished on the basis of an etch process, wherein the selectivity to other process materials, such as an underlying etch stop layer and the like, may be advantageously used to adjust the amount of "leveling" in the spaces by controlling the respective etch time. In other illustrative embodiments, the removal of any excess material may be accomplished on the basis of an etch process that may be controlled by providing an appropriate etch indicator material or etch stop material, for instance, formed on an underlying material layer and/or within the interlayer dielectric material to be removed in the subsequent etch process, thereby enabling enhanced process uniformity due to a reduction of substrate-to-substrate variations of the corresponding etch process.

Another illustrative aspect of the subject matter disclosed herein addresses reliability issues caused by the difference of the deposition rate on underlying dielectric materials of different intrinsic stress levels by providing an appropriate buffer layer, which may significantly reduce the effect of the different stress levels on the subsequent deposition of the interlayer dielectric material by the deposition process having a high gap filling capability. In this case, the buffer layer may be provided in the form of any appropriate material with a reduced thickness compared to a subsequent interlayer dielectric material, while still efficiently balancing the deposition rate above various device regions having formed therein materials of different stress levels. In some illustrative embodiments, the interlayer dielectric material deposited on the buffer layer may be subsequently removed to a certain degree, as described above, in order to restrict the amount of material of inferior material characteristics in the interlayer dielectric material to a desired low level, while the buffer layer may provide enhanced process uniformity during the deposition of the interlayer dielectric material and during the subsequent removal of a portion thereof. In some illustrative embodiments, the buffer layer may be provided in the form of any appropriate material to obtain the desired "decoupling" of the respective growth rates from the intrinsic stress levels of the underlying materials and/or the buffer layer may provide enhanced device stability during the further processing, for instance in view of "passivating" the interlayer dielectric material to be deposited thereon, thereby also enhancing the overall reliability thereof.

It should be appreciated that a deposition process having high gap filling capabilities is to be understood as a CVD-based process, in which the deposition ambient is established as a thermally activated ambient on the basis of appropriate precursor materials, such as TEOS, wherein a corresponding pressure in the deposition ambient may be 250 Torr and higher, which may also be referred to as a sub-atmospheric deposition process (SACVD). In other cases, a deposition process having high gap filling capabilities may be understood as a CVD-based process, the deposition ambient of which may be established on the basis of a plasma ambient with moderately high pressure, for instance above approximately 20 Torr, which may also be referred to as high density PECVD process.

Figure 1B:
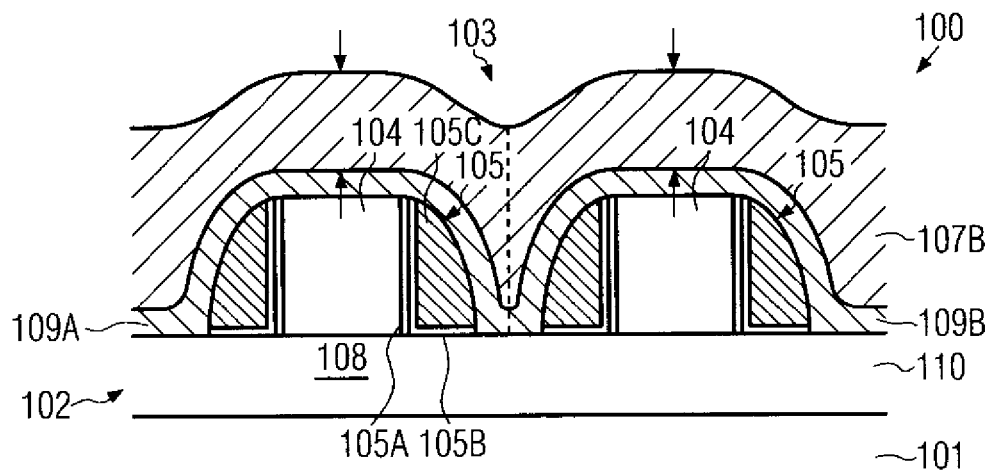
Figure 2A:
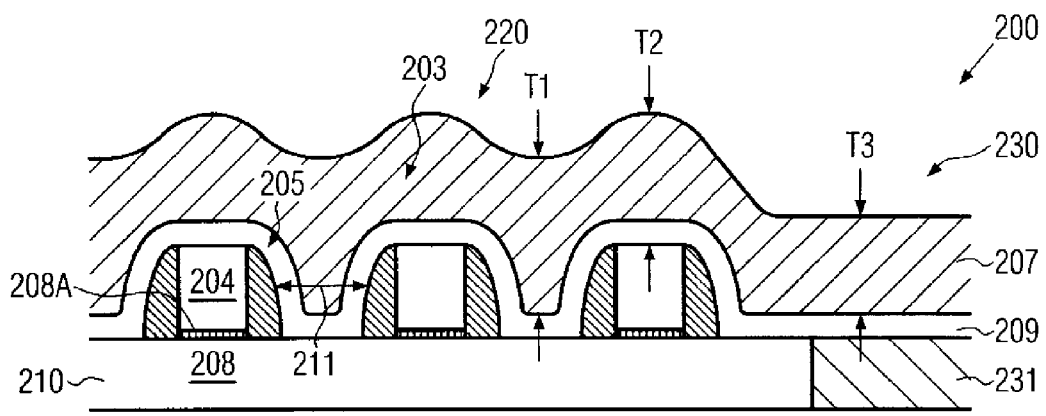
FIGS. 2a-2c schematically illustrate cross-sectional views of a semiconductor device during various manufacturing stages for forming an interlayer dielectric material using a deposition process of high gap filling capabilities while maintaining the overall amount of material deposited thereby at a low level according to illustrative embodiments disclosed herein.

FIG. 2a schematically illustrates a cross-sectional view of a semiconductor 200 which may comprise a substrate 201 that may represent any appropriate carrier material for forming thereabove circuit elements as required in advanced semiconductor devices. For instance, the substrate 201 may represent a semiconductor substrate, an upper portion of which may define a device layer 210, which may comprise crystalline semiconductor areas, possibly in combination with respective isolation structures, such as shallow trench isolations and the like. In other cases, the substrate 201 may represent a carrier material having formed thereon an insulating layer (not shown) on which may be provided the device layer 210, for instance, in the form of a crystalline semiconductor material. In this case, the substrate 201, in combination with the device layer 210, may be considered as an SOI configuration. It should be appreciated that the combination of the substrate 201 and the device layer 210 may represent a bulk configuration in some device areas and may represent an SOI configuration in other areas, depending on the device requirements. In the illustrative embodiment shown, the semiconductor device 200 may comprise a first device region 220 and a second device region 230, which may differ from each other at least in the minimum spacing between adjacent structural features provided in the first and second device regions 220, 230. In one illustrative embodiment, the first device region 220 may comprise a line structure 203, which may include a plurality of line features 204, such as polysilicon lines, gate electrode structures and the like. For example, the line structure 203 may have substantially the same configuration as previously described with reference to the line structure 103 shown in FIGS. 1a-1b. Thus, the lines 204 may represent gate electrodes, which may be formed on corresponding gate insulation layers 208A that separate the electrodes 204 from respective channel regions 208. Moreover, depending on the process strategy, in the manufacturing stage shown, a respective spacer structure 205 may be formed adjacent to the lines 204.

It should be appreciated that appropriate dopant profiles may have been formed within the device layer 210 so as to appropriately "pattern" the conductivity therein. For instance, respective drain and source regions (not shown) may be defined by appropriately selected dopant profiles, as is well known in the art. On the other hand, the second device region 230 may represent an area of reduced surface topography, when, for instance, isolation structures 231 may be formed within the device layer 210. Furthermore, the semiconductor device 200 may comprise an etch stop layer 209, which may represent any appropriate material layer used for patterning an interlayer dielectric material still to be formed above the first and second device regions 220, 230. For instance, as previously explained, the etch stop layer 209 may be provided in the form of a nitrogen-containing material, such as silicon nitride, nitrogen-containing silicon carbide, or the layer 209 may be provided in the form of silicon carbide and the like. In some illustrative embodiments, as will be described later on in more detail with reference to FIGS. 3a-3d or as is also explained with reference to FIG. 1b, the etch stop layer 209 may be provided with a high intrinsic stress level which may be different for different types of circuit elements, such as P-channel transistors and N-channel transistors. Moreover, the device 200 may comprise a first interlayer dielectric material 207 formed above the first and second device regions 220, 230 such that substantially no voids may be formed in spaces 211 between adjacent line features 204. As previously explained, the structure 203 may be referred to as a closely spaced or densely packed line structure, since the spaces 211 may have a lateral size in the horizontal direction of FIG. 2a on the order of magnitude of 100 nm and less, as previously explained.

The semiconductor device 200 as shown in FIG. 2a may be formed on the basis of similar processes or techniques, as previously described with reference to the device 100. That is, after providing the substrate 201 including the device layer 210, which may be appropriately patterned for defining the first and second device regions 220, 230, for instance by forming the isolation structures 231, respective circuit elements, such as the line structure 203, may be formed on the basis of well-established process techniques. For this purpose, the lines 204 in combination with the insulation layers 208A may be formed on the basis of well-established and advanced lithography, deposition, oxidation, etch and planarization techniques, followed by the definition of appropriate dopant profiles (not shown) for obtaining respective transistor structures, when the lines 204 represent gate electrode structures. Thereafter, metal silicide regions (not shown) may be formed, if required, and thereafter the etch stop layer 209 may be deposited by well-established deposition techniques, thereby providing the desired material characteristics, for instance, in terms of etch selectivity, intrinsic stress level and the like.

As previously explained, forming the etch stop layer 209 may include several deposition and etch processes, when different devices in the first device region 220 are to obtain a different degree or type of intrinsic stress. The first interlayer dielectric material 207 may be deposited on the basis of an appropriate process technique having a high gap filling capability to substantially avoid the creation of structural irregularities, such as voids, within the spaces 211, the aspect ratio of which may be determined by the configuration of the lines 204 including the spacer structures 205 and the characteristics of the etch stop layer 209. In one illustrative embodiment, the layer 207 may be deposited by a SACVD process on the basis of TEOS in order to form the layer 207 as a silicon dioxide based material, wherein the deposition process may provide a highly non-conformal deposition behavior, thereby preferably filling the remaining spaces 211. A thickness of the layer 207 may vary in the first device region 220 such that a thickness T1 corresponding to a space 211 may be higher compared to a thickness T2, representing a substantially horizontal portion of the lines 204. Furthermore, a thickness T3 in the second device region 230 may differ from the thickness T1 and may be similar to the thickness T2 due to the substantially flow-like deposition behavior of the SACVD process.

As previously explained, in some illustrative aspects, the amount of material of the layer 207 may be significantly reduced compared to conventional strategies so that the deposition of the layer 207 may be controlled such that a reliable filling of the spaces 211 is obtained substantially without providing too much excess material. For instance, the layer 207 may be deposited so as to obtain a thickness, for instance, referring to the thickness T2 or T3, having a value of approximately 100-300 nm, depending on the device requirements.

Figure 2B:
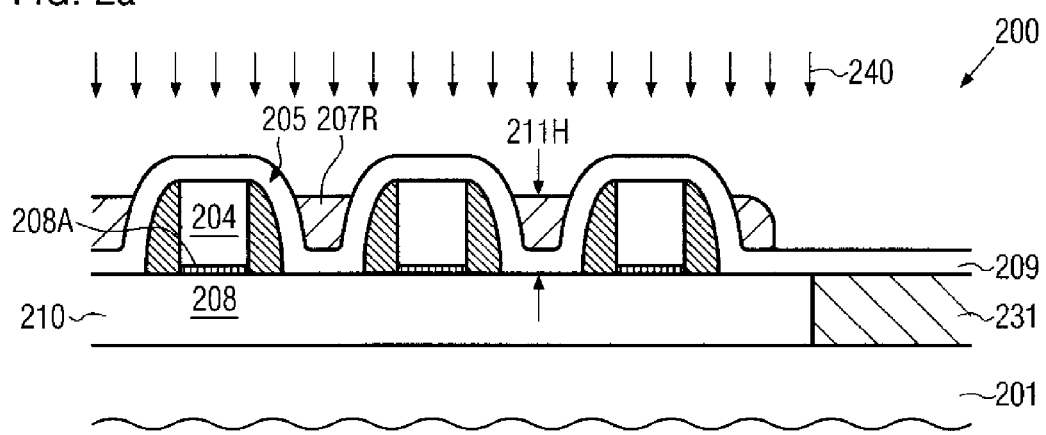

FIG. 2b schematically illustrates the semiconductor device 200 in a further advanced manufacturing stage. As shown, the device 200 is exposed to an etch ambient 240 designed to selectively remove material of the layer 207 with respect to an underlying material, such as the etch stop layer 209. In some illustrative embodiments, the etch ambient 240 may be established on the basis of a plasma-based atmosphere including an etch chemistry that may be highly selective with respect to the etch stop layer 209. For instance, the interlayer dielectric material 207 may be provided in the form of a silicon dioxide based material, while the etch stop layer 209 may represent a silicon nitride material, a nitrogen-containing silicon carbide material or a silicon carbide material, for which highly selective etch recipes are well established in the art. Thus, in some illustrative embodiments, the etch process 240 may be performed as a substantially anisotropic process, thereby continuously removing material from the layer 207 in a substantially vertical direction, wherein, in the embodiment shown in FIG. 2b, the etch process may be continued until horizontal material portions are substantially removed. That is, due to the substantially vertically oriented etch front, the layer portions having the thickness T2, T3 in the first and second device regions may be substantially removed prior to a complete removal of the material of the layer 207 within the spaces 211 due to the greater thickness T1 compared to the thickness values T2 and T3. Thus, respective material residues 207R may be maintained within the spaces 211, thereby efficiently reducing the effective aspect ratio "seen" by a subsequent deposition process and thus relaxing any constraints imposed to the subsequent deposition process for the interlayer dielectric material having the desired material characteristics. Due to the high degree of etch selectivity, the actual height level, indicated as 211H, in the respective spaces 211 may be adjusted by the process time of the etch process 240, substantially without negatively affecting the structure 203 or any components in the second device region 230. In this way, the amount of residual material 207R may be reduced to any desired value that is compatible with the gap fill capabilities of the subsequent deposition process, while any adverse effects of the material characteristics of the reduced amount of the residual material may be significantly reduced, such as the capability of absorbing moisture, which is significantly higher for an SACVD deposited silicon dioxide compared to a PECVD deposited silicon dioxide, as previously explained.

Figure 2C:
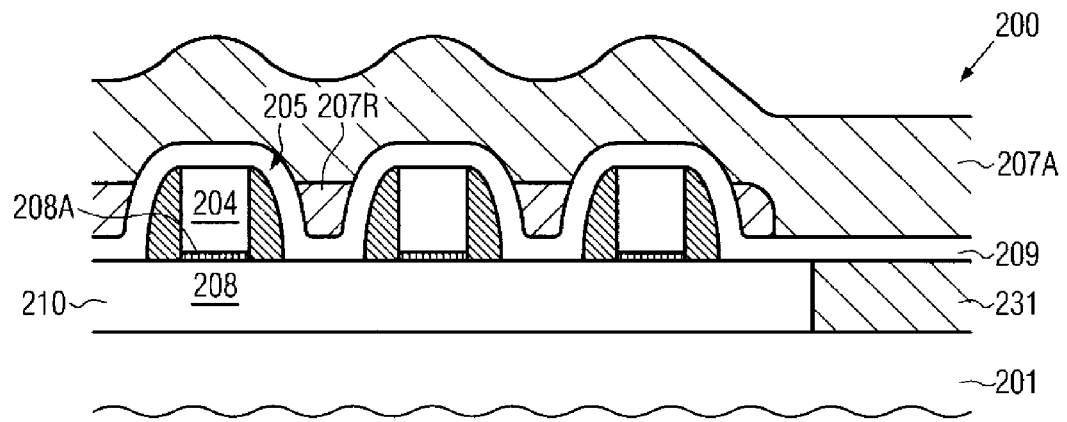

FIG. 2c schematically illustrates the semiconductor device 200 in a further advanced manufacturing stage, in which a second interlayer dielectric material 207A is formed above the first and the second device regions 220, 230, wherein the interlayer dielectric material 207A may have enhanced material characteristics, for instance a less reduced degree of outgassing, a high resistance against water absorption, increased mechanical strength during the subsequent CMP process and the like. The layer 207A may be formed on the basis of a PECVD process, for instance using TEOS and ozone as previously explained, wherein the reduced aspect ratios obtained by the material residues 207R provides a high degree of deposition uniformity, as explained above. Consequently, the total amount of material of the layer 207, i.e., the residues 207R, may be significantly reduced compared to conventional strategies, thereby enhancing the overall reliability of the interlayer structure of the device 200 and also enhancing the process uniformity during the further processing of the device 200. In the embodiment shown, the second device region 230 may substantially completely lack any material residues 207R, depending on the previous surface topography.

Thereafter, the further processing may be continued, for instance by planarizing the surface topography of the material 207A, for instance on the basis of CMP, wherein well-established process techniques may be used, as previously explained. Next, respective contact openings may be formed on the basis of photolithography and etch techniques, wherein the etch stop layer 209 may be used as an efficient etch stop for forming contact openings in the layer 207A and the residues 207R. Subsequently, the etch stop layer 209 may be opened to allow the respective contact openings to extend to contact areas of the device layer 210 and the lines 204 according to device requirements.

Figure 2D:
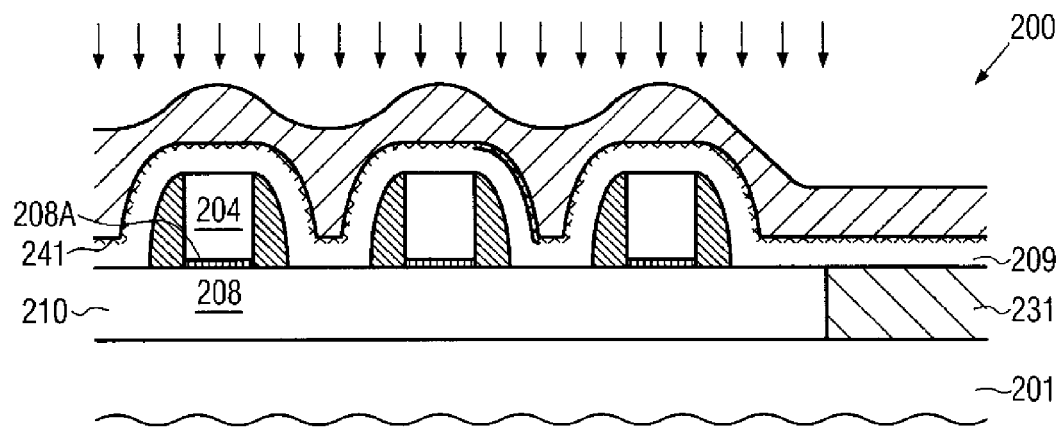
FIG. 2d schematically illustrates a cross-sectional view of the semiconductor device as shown in FIGS. 2a-2c, wherein, additionally, an enhanced control is obtained during a material removal process for reducing the amount of non-desired interlayer dielectric material according to still further illustrative embodiments.

FIG. 2d schematically illustrates the semiconductor device 200 in accordance with other illustrative embodiments, in which enhanced process uniformity may be obtained during the etch process 240 by providing an appropriate etch indicator material 241 at an appropriate position. For instance, in one illustrative embodiment, the etch indicator material 241 may be provided at a surface area of the etch stop layer 209, wherein the indicator material 241 may comprise one or more appropriate atomic species that cause a prominent endpoint detection signal when liberated during the etch process 240. As is well known, respective optical measurement techniques, referred to as endpoint detection, may be used during plasma-based etch processes, in which absorption and/or emission spectra may be obtained from the gaseous ambient to identify respective wavelengths or wavelength ranges indicating the presence or absence of certain species, as well as the amount thereof. Thus, by positioning an appropriate species providing a well-detectable endpoint signal, the exposure of the respective etch stop layer 209 may be detected in a highly reliable manner, thereby reducing substrate-to-substrate variations during the etch process 240. In other cases, the indicator material 241 may be provided within the layer 207, for instance by introducing a precursor material of the indicator species 241 into the deposition atmosphere at any appropriate phase of the deposition process, so that the progression of the etch process 240 may be monitored on the basis of the absence or presence of the respective species 241 within the etch ambient. Since typically the uniformity of deposition processes is higher compared to the uniformity of etch processes, an enhanced degree of overall process uniformity may be gained by providing the species 241 within the interlayer dielectric material 207. In still other illustrative embodiments, the indicator material 241 may be incorporated into the material 207 by ion implantation, wherein any appropriate species may be used and wherein, for a known thickness of the layer 207, any appropriate penetration depth may be selected on the basis of respective implantation parameters. Hence, also in this case, improved process uniformity during the etch process 240 may be obtained, since typically the process variations of respective implantation processes are less compared to the fluctuations of etch processes, such as the process 240.

With reference to FIGS. 3a-3d, further illustrative embodiments will now be described in which, additionally or alternatively to the embodiments described above, the reliability of the interlayer dielectric material may be enhanced by increasing the process uniformity during the deposition of the interlayer dielectric material on the basis of the deposition process having a high gap filling capability, such as SACVD and the like.

Figure 3A:
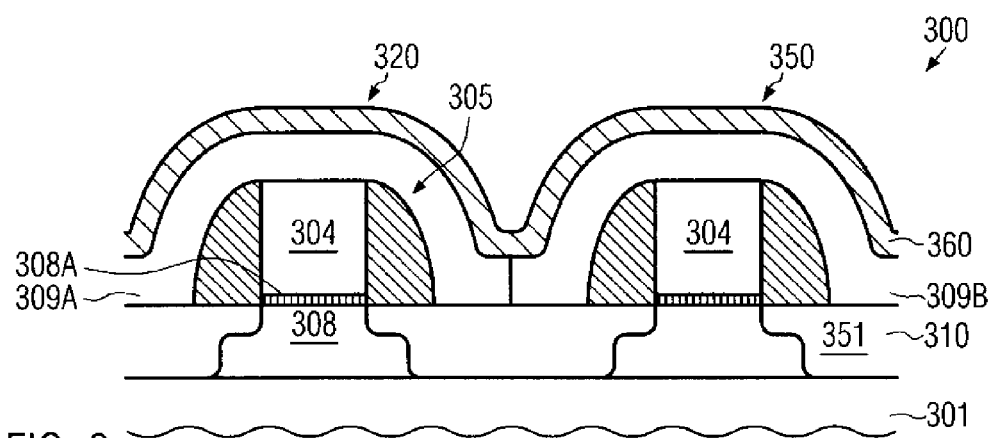
FIGS. 3a-3b schematically illustrate cross-sectional views of a semiconductor device during a sequence for forming an interlayer dielectric material portion on the basis of a deposition process with high gap filling capability, wherein increased uniformity of the respective growth rate on dielectric materials of different intrinsic stress levels may be accomplished on the basis of a buffer layer according to further illustrative embodiments disclosed herein.

FIG. 3a schematically illustrates a cross-sectional view of a semiconductor device 300 comprising a substrate 301 and a device layer 310 in the form of a substantially crystalline semiconductor layer, such as a silicon-based layer and the like. The device 300 may comprise a first circuit element 320, for instance in the form of a field effect transistor, and a second circuit element 350, for instance in the form of a field effect transistor of different configuration compared to the circuit element 320. In one illustrative embodiment, the circuit elements 320, 350 may represent transistors of opposite conductivity type, which may require a different type of strain in the respective channel regions 308 in order to enhance the transistor performance thereof, as previously explained. In this case, the circuit elements 320, 350 may comprise gate electrodes 304 formed on respective gate insulation layers 308A. Furthermore, spacer structures 305 may be provided, as required in this manufacturing stage, and drain and source regions 321 of a specific conductivity type may be provided in the circuit element 320, while drain and source regions 351 of opposite conductivity type may be provided in the circuit element 350. Furthermore, a first etch stop layer 309A may be formed above the circuit element 320 and may have a high intrinsic stress appropriate for creating the desired strain in the channel region 308 for enhancing the charge carrying mobility therein. Similarly, a second etch stop layer 309B may be formed above the second circuit element 350 with a high intrinsic stress of opposite type compared to the layer 309A in order to induce the desired type of strain enhancing the transistor performance of the circuit element 350.

Furthermore, the device 300 comprises a buffer layer 360 that is formed above, and in some illustrative embodiments on, the first and the second etch stop layers 309A, 309B, wherein the material characteristics of the buffer layer 360 and the thickness thereof may be selected so as to significantly reduce the effect of the intrinsic stress levels of the underlying layers 309A, 309B with respect to a subsequently deposited material. For instance, the buffer layer 360 may be deposited with a significantly lower intrinsic stress level compared to the layers 309A, 309B, thereby providing an appropriate deposition surface for a subsequent deposition process of high gap filling capabilities and highly uniform deposition rates above the first and second circuit elements 320, 350. In one illustrative embodiment, the buffer layer 360 may be provided as a silicon dioxide layer with enhanced mechanical strengths, for instance in the form of a PECVD silicon dioxide, wherein the thickness of the layer 360 is selected such that a conformal deposition behavior is obtained without an increased probability for creating deposition irregularities, such as voids, between the first and second circuit elements 320, 350. In other illustrative embodiments, the buffer layer 360 may be provided in the form of a nitrogen-containing material or a silicon carbide material with a low intrinsic stress level so as to compensate for the stress level difference, while not unduly affecting the stress transfer mechanism provided by the highly stressed layers 309A, 309B. In other cases, the buffer layer 360 may be provided with high intrinsic stress, when an effect thereof on the one of the layers 309A, 309B that has the opposite intrinsic stress is tolerable, thereby creating substantially uniform process conditions for the subsequent deposition process, such as the SACVD process.

Figure 3B:
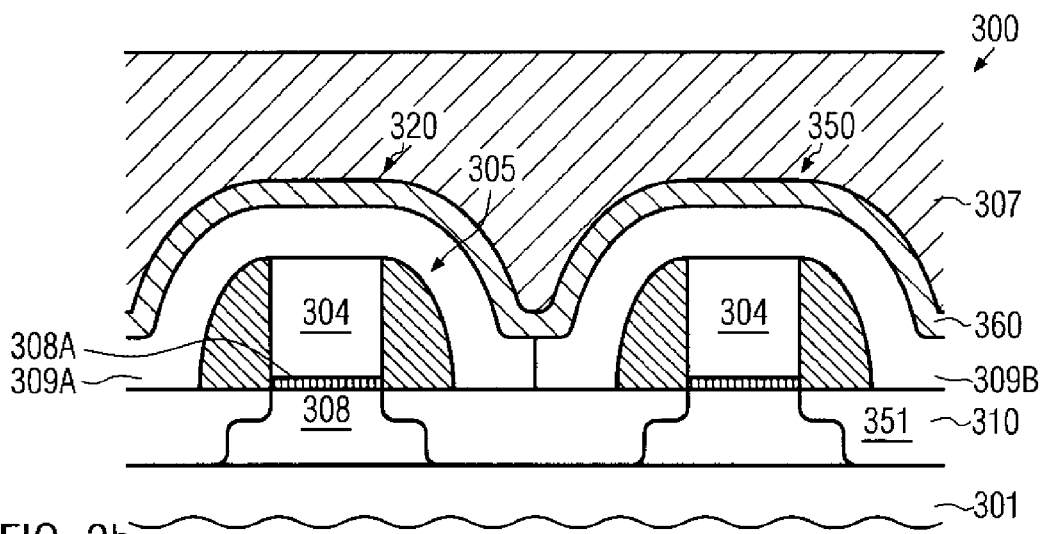

FIG. 3b schematically illustrates the semiconductor device 300 in a further advanced manufacturing stage, in which at least a portion of an interlayer dielectric material 307 is formed on the buffer layer 360 so as to reliably fill respective spaces on the basis of an appropriate deposition technique, such as SACVD, as previously explained. Depending on the device requirements, the interlayer dielectric material 307 may be deposited with any appropriate thickness, since the buffer layer 360 may provide a highly uniform deposition rate above the circuit elements 320, 350, while, in some cases, the buffer layer 360 may also provide an efficient "passivation" of the underlying circuit elements with respect to, for instance, incorporation of moisture and the like. In other illustrative embodiments, the interlayer dielectric material 307 may be deposited with a thickness designed to reliably fill any spaces and to provide a surface of reduced topography for a subsequent deposition of a further interlayer dielectric material, such as a PECVD silicon dioxide, as previously explained.

Figure 3C:
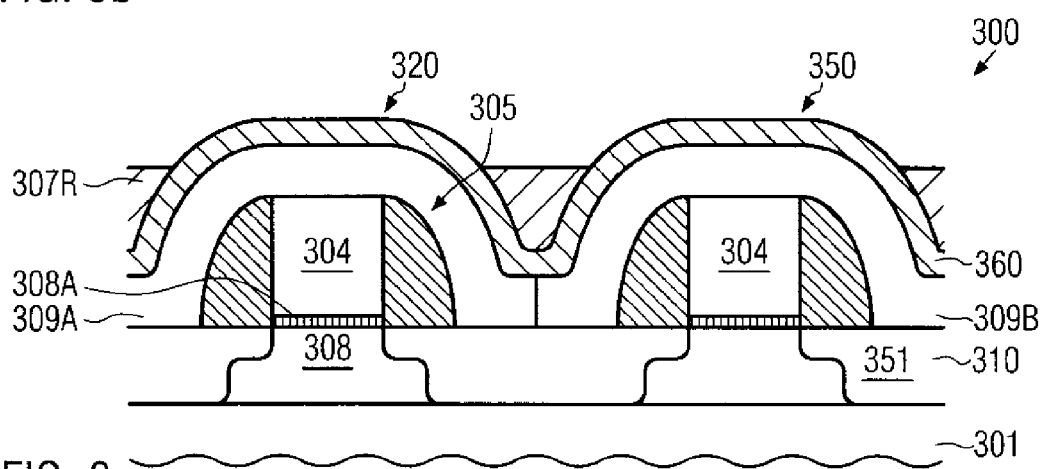
FIGS. 3c-3d schematically illustrate cross-sectional views of the semiconductor device of FIGS. 3a-3b, wherein additional process steps may be performed to reduce the amount of interlayer dielectric material deposited by the deposition technique having the high gap filling capability according to further illustrative embodiments disclosed herein.

FIG. 3c schematically illustrates the semiconductor device 300 according to a further illustrative embodiment, in which the interlayer dielectric material 307 may be partially removed by an etch process 340 in order to reduce the amount of material of the layer 307 while nevertheless providing enhanced process uniformity during the further deposition of an interlayer dielectric material having the desired material characteristics. Thus, the aspect ratios of respective spaces may be sufficiently reduced, as previously explained, while the buffer layer 360 may provide enhanced across-substrate uniformity during the etch process 340, since the respective growth rates during the deposition of the material 307 may be substantially identical or at least very similar to each other, irrespective of the stress level of the underlying etch stop layers. Moreover, as previously discussed, an appropriate indicator material may, in some cases, be incorporated into the buffer layer 360 in order to provide a well-detectable endpoint detection signal, thereby allowing an efficient control of the etch process 340. In this manner, an exposure of the etch stop layers 309A, 309B may essentially be avoided, thereby not negatively affecting the strain-inducing effect of these layers.

Figure 3D:
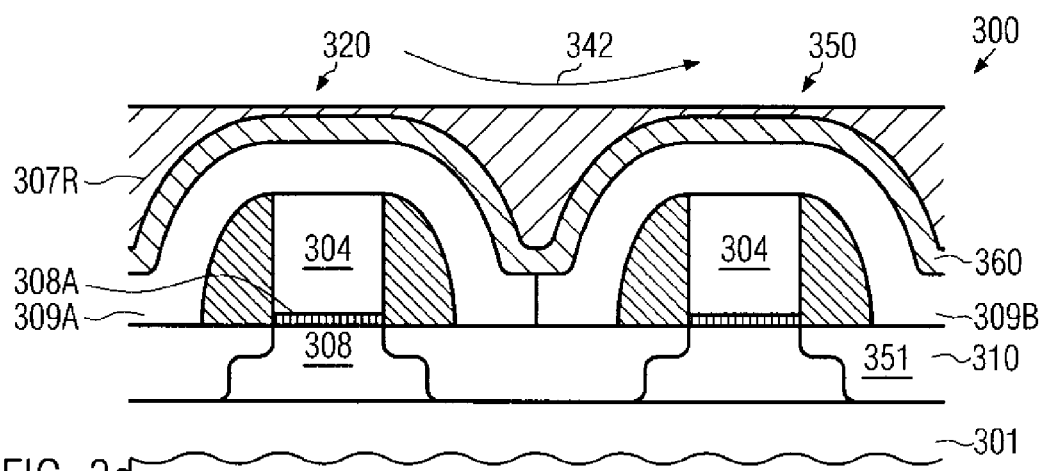

FIG. 3d schematically illustrates the semiconductor device 300 according to a further illustrative embodiment in which a material removal of a portion of the layer 307 may be accomplished on the basis of a chemical mechanical polishing process 342, wherein the buffer layer 360 may confine the material residues 307R of the layer 307 and may also act as a CMP stop layer in order to substantially avoid undue exposure of the respective etch stop layers 309A, 309B. In some illustrative embodiments, the etch process 340 and the polishing process 342 may be combined, wherein, for instance, in a first step, the polishing process 342 may be performed to obtain a highly planar surface on which the etch process 340 may be performed with high uniformity in order to define the desired height level of the residues 307R. In other cases, the etch process 340 may be performed first and thereafter the polishing process 342 may provide a highly planar surface topography, thereby enhancing the process uniformity of the subsequent deposition of a further interlayer dielectric material, such as silicon dioxide formed by a PECVD process.

As a result, the subject matter disclosed herein provides methods and semiconductor devices having an interlayer dielectric material of increased reliability, since negative effects of non-desired material characteristics or process characteristics during the deposition of an interlayer dielectric material component may be reduced by reducing the amount of excess material on the basis of an etch process and/or by providing an appropriate buffer layer to enhance the deposition uniformity above dielectric materials having different intrinsic stress levels, thereby also enhancing process uniformity of further processes. Consequently, the gap fill capabilities of sophisticated SACVD processes may be used in forming interlayer dielectric materials of high uniformity, while the effects of respective material characteristics, such as increased water absorption capability as is a typical material characteristic of TEOS silicon dioxide deposited by SACVD, enhanced degree of out-gassing, reduced mechanical stability and the like, may be efficiently reduced compared to conventional strategies. Thus, an interlayer dielectric material of enhanced characteristics, such as reduced moisture absorption, as is typical for PECVD TEOS silicon dioxide, may be formed above an SACVD material of reduced amount.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an etch stop material above a plurality of densely spaced transistors of a semiconductor device, wherein a first portion of said etch stop layer is formed above a first one of said transistors with compressive stress and a second portion of said etch stop layer is formed above a second one of said transistors with tensile stress;
   forming a first interlayer dielectric material above said densely spaced transistors and said etch stop material by a first deposition process designed to completely fill spaces formed between said densely spaced transistors;
   removing a portion of said first interlayer dielectric material to maintain said spaces at least partially filled with said first interlayer dielectric material; and
   forming a second interlayer dielectric material above said first interlayer dielectric material.

2. The method of claim 1, wherein removing a portion of said first interlayer dielectric material comprises performing an etch process to remove said portion of the first interlayer dielectric material selectively to said etch stop material.

3. The method of claim 2, wherein said etch process is performed without using an etch mask.

4. The method of claim 2, further comprising providing an indicator material above said transistors and controlling said etch process by using a signal caused by etching said indicator material.

5. The method of claim 1, wherein said first interlayer dielectric material is formed by performing a sub-atmospheric chemical vapor deposition process using a silicon-containing precursor material.

6. The method of claim 5, wherein said second interlayer dielectric material is formed by performing a plasma enhanced chemical vapor deposition process using a silicon-containing precursor material.

7. The method of claim 1, wherein a width of said space is approximately 100 nm or less.

8. The method of claim 1, further comprising forming a buffer layer above said first and second portions of said etch stop layer prior to forming said first interlayer dielectric material.

9. The method of claim 1, wherein removing a portion of said first interlayer dielectric material comprises performing a chemical mechanical polishing process.

10. A method, comprising:
    forming a first etch stop layer above a first plurality of transistors, said first etch stop layer having an intrinsic compressive stress;
    forming a second etch stop layer above a second plurality of transistors, said second etch stop layer having an intrinsic tensile stress;
    forming a buffer layer above said first and second etch stop layers by a first deposition technique providing a substantially conformal deposition behavior in spaces between neighboring ones of said first and second transistors; and
    forming a first interlayer dielectric material on said buffer layer by a second deposition technique having an increased gap fill capability compared to said first deposition technique to completely fill said spaces;
    removing a portion of said first interlayer dielectric material to maintain said spaces at least partially filled with said interlayer dielectric material; and
    forming a second interlayer dielectric material above said first interlayer dielectric material.

11. The method of claim 10, wherein said buffer layer is deposited by plasma enhanced chemical vapor deposition.

12. The method of claim 10, wherein said second interlayer dielectric material is formed by a sub-atmospheric chemical vapor deposition.

13. The method of claim 10, wherein said buffer material is comprised of silicon dioxide and said at least a portion of said interlayer dielectric material is comprised of silicon dioxide.

14. The method of claim 13, wherein forming said first interlayer dielectric material comprises depositing a first silicon dioxide layer by a thermal chemical vapor deposition process based on TEOS.

15. The method of claim 14, wherein forming said second interlayer dielectric material further comprises depositing a second layer of silicon dioxide on said first layer by a plasma enhanced chemical vapor deposition process based on TEOS.

16. The method of claim 10, wherein said buffer layer is comprised of a nitrogen-containing material having a lower intrinsic stress level compared to said first and second etch stop layers.

17. A method, comprising:
    forming a first etch stop layer above a first plurality of transistors, said first etch stop layer having an intrinsic compressive stress;
    forming a second etch stop layer above a second plurality of transistors, said second etch stop layer having an intrinsic tensile stress;
    forming a buffer layer above said first and second etch stop layers by a first deposition technique providing a substantially conformal deposition behavior in spaces between neighboring ones of said first and second transistors, wherein said buffer layer is comprised of a nitrogen-containing material having a lower intrinsic stress level compared to said first and second etch stop layers; and
    forming at least a portion of an interlayer dielectric material on said buffer layer by a second deposition technique having an increased gap fill capability compared to said first deposition technique.

18. The method of claim 17, wherein said buffer layer is deposited by plasma enhanced chemical vapor deposition.

19. The method of claim 17, wherein said at least a portion of said interlayer dielectric material is formed by a sub-atmospheric chemical vapor deposition.

20. The method of claim 19, wherein forming said at least a portion of said interlayer dielectric material comprises depositing a first silicon dioxide layer by a thermal chemical vapor deposition process based on TEOS.

21. The method of claim 20, further comprising depositing a second layer of silicon dioxide on said first layer by a plasma enhanced chemical vapor deposition process based on TEOS.

22. The method of claim 17, further comprising removing a part of said at least a portion of said interlayer dielectric material prior to depositing a further portion of said interlayer dielectric material.

23. A method, comprising:
    forming an etch stop material above a plurality of circuit elements of a semiconductor device, said circuit elements comprising densely spaced line features, wherein a first portion of said etch stop layer is formed above a first one of said circuit elements with compressive stress and a second portion of said etch stop layer is formed above a second one of said circuit elements with tensile stress;

forming a first interlayer dielectric material above said circuit elements and said etch stop material by a first deposition process designed to completely fill spaces formed between said densely spaced line features;

removing a portion of said first interlayer dielectric material to maintain said spaces at least partially filled with said first interlayer dielectric material; and forming a second interlayer dielectric material above said first interlayer dielectric material.

* * * * *